(12) United States Patent
Ramakrishnan et al.

(10) Patent No.: US 9,504,164 B2
(45) Date of Patent: Nov. 22, 2016

(54) MANUFACTURING OF HIGH RESOLUTION CONDUCTIVE PATTERNS USING ORGANOMETALLIC INK AND BANDED ANILOX ROLLS

(71) Applicant: Eastman Kodak Company, Rochester, NY (US)

(72) Inventors: Ed S. Ramakrishnan, The Woodlands, TX (US); Danliang Jin, The Woodlands, TX (US)

(73) Assignee: EASTMAN KODAK COMPANY, Rochester, NY (US)

( * ) Notice: Subject to any disclaimer, the term of this patent is extended or adjusted under 35 U.S.C. 154(b) by 0 days.

(21) Appl. No.: 14/398,686

(22) PCT Filed: Mar. 12, 2013

(86) PCT No.: PCT/US2013/030450
§ 371 (c)(1),
(2) Date: Nov. 3, 2014

(87) PCT Pub. No.: WO2013/165567
PCT Pub. Date: Nov. 7, 2013

(65) Prior Publication Data
US 2015/0101745 A1   Apr. 16, 2015

Related U.S. Application Data

(60) Provisional application No. 61/647,597, filed on May 16, 2012, provisional application No. 61/642,919, filed on May 4, 2012.

(51) Int. Cl.
*H05K 3/12*  (2006.01)
*B32B 38/14*  (2006.01)
(Continued)

(52) U.S. Cl.
CPC ............. *H05K 3/1275* (2013.01); *B41F 5/24* (2013.01); *B41F 23/002* (2013.01);
(Continued)

(58) Field of Classification Search
CPC ................. H05K 3/1275; B32B 38/14; B42D 15/10; G09F 3/10
See application file for complete search history.

(56) References Cited

U.S. PATENT DOCUMENTS 6,343,550 B1 * 2/2002 Feesler ............... B41F 13/10
101/375
6,378,426 B1 * 4/2002 Furr, Jr. ............... B41F 5/24
101/328

(Continued)

FOREIGN PATENT DOCUMENTS

JP      2006076080 A    3/2006
KR    1020070099920    10/2007
(Continued)

OTHER PUBLICATIONS

PCT/US2013/030450 International Search Report and Written Opinion dated Mar. 12, 2013 (11 pgs.).

*Primary Examiner* — Mark A Osele
*Assistant Examiner* — Christopher C Caillouet

(57) ABSTRACT

Disclosed herein are systems methods for using ink comprising organometallics in a flexographic printing process using engraved anilox rolls to transfer ink to an impression roll that prints a pattern on a substrate. A banded anilox roll with more than one geometry and/or volume of cells may be used in these production systems and methods. The pattern printed may comprise a plurality of lines which are each from 1 micrometer-25 micrometers wide and may be part of an electronics application such as a touch screen sensor or an (Continued)

RF antenna that requires microscopic conductive patterns such as touch screen displays or antennas.

10 Claims, 10 Drawing Sheets

(51) Int. Cl.
| | |
|---|---|
| *G09F 3/10* | (2006.01) |
| *B41F 5/24* | (2006.01) |
| *G06F 3/041* | (2006.01) |
| *B41F 31/04* | (2006.01) |
| *B41F 31/06* | (2006.01) |
| *B41F 31/20* | (2006.01) |
| *B41F 23/00* | (2006.01) |
| *B41F 23/04* | (2006.01) |
| *C23C 18/16* | (2006.01) |
| *C23C 18/31* | (2006.01) |
| *C23C 18/34* | (2006.01) |
| *C23C 18/40* | (2006.01) |
| *C23C 18/44* | (2006.01) |
| *H01Q 7/00* | (2006.01) |
| *H01Q 21/00* | (2006.01) |
| *C09D 11/037* | (2014.01) |
| *C09D 11/52* | (2014.01) |
| *B41M 1/04* | (2006.01) |
| *H05K 3/24* | (2006.01) |
| *H05K 3/26* | (2006.01) |

(52) U.S. Cl.
CPC ........... *B41F 23/0409* (2013.01); *B41F 31/04* (2013.01); *B41F 31/06* (2013.01); *B41F 31/20* (2013.01); *C09D 11/037* (2013.01); *C09D 11/52* (2013.01); *C23C 18/1608* (2013.01); *C23C 18/1637* (2013.01); *C23C 18/1639* (2013.01); *C23C 18/1641* (2013.01); *C23C 18/31* (2013.01); *C23C 18/34* (2013.01); *C23C 18/40* (2013.01); *C23C 18/44* (2013.01); *G06F 3/041* (2013.01); *H01Q 7/00* (2013.01); *H01Q 21/0087* (2013.01); *B41M 1/04* (2013.01); *G06F 2203/04103* (2013.01); *H05K 3/246* (2013.01); *H05K 3/26* (2013.01); *H05K 2203/0143* (2013.01); *H05K 2203/072* (2013.01); *Y10T 156/10* (2015.01); *Y10T 156/1052* (2015.01)

(56) References Cited

U.S. PATENT DOCUMENTS

| | | | | |
|---|---|---|---|---|
| 6,422,143 | B1* | 7/2002 | Lawrence | B41F 5/20 101/216 |
| 2004/0012570 | A1* | 1/2004 | Cross | G06F 3/045 345/173 |
| 2006/0204718 | A1 | 9/2006 | Kawakami | |
| 2008/0202912 | A1* | 8/2008 | Boddie | H03K 17/962 200/600 |
| 2008/0277626 | A1 | 11/2008 | Yang et al. | |
| 2010/0201649 | A1* | 8/2010 | Kai | G06F 3/045 345/174 |
| 2010/0209594 | A1* | 8/2010 | Curtis | B41M 5/0023 427/74 |
| 2011/0102361 | A1* | 5/2011 | Philipp | G06F 3/044 345/174 |
| 2011/0310037 | A1* | 12/2011 | Moran | G06F 3/0412 345/173 |

FOREIGN PATENT DOCUMENTS

| | | |
|---|---|---|
| WO | 2011139882 A2 | 11/2011 |
| WO | 2013165567 A1 | 11/2013 |

* cited by examiner

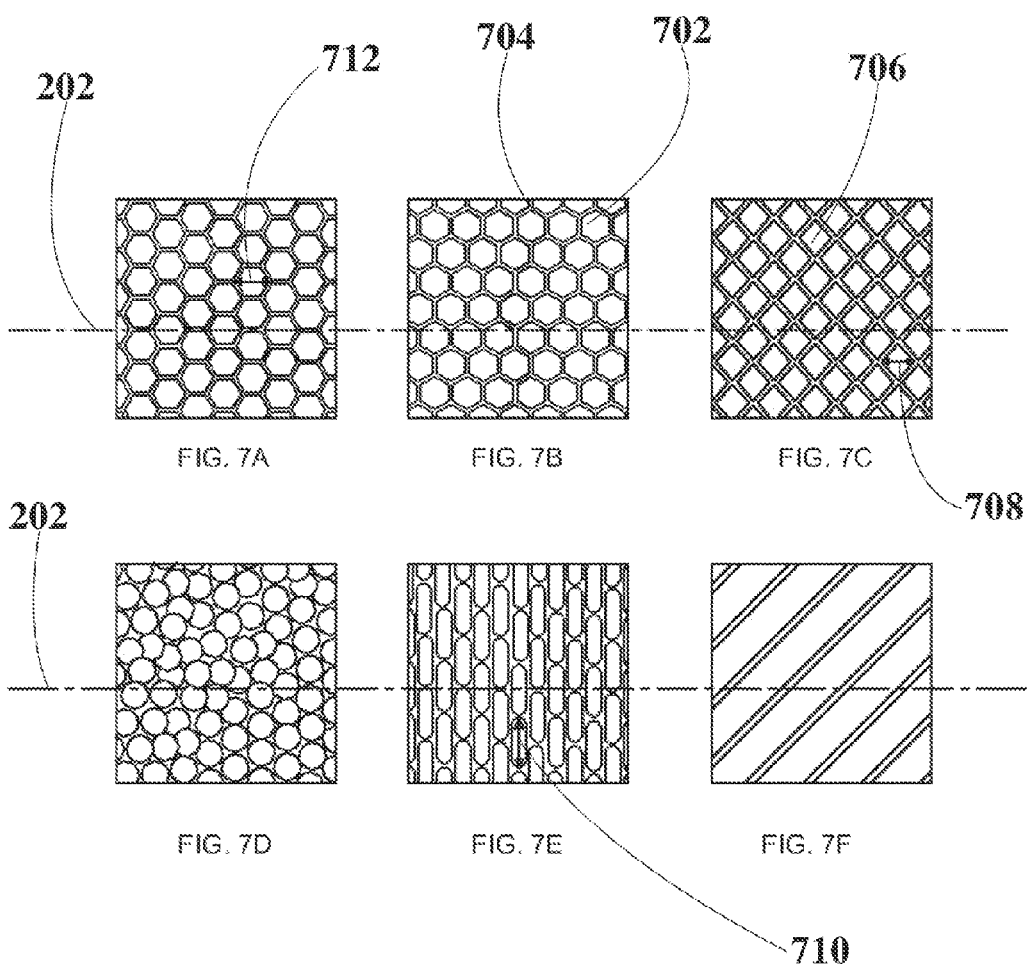

US 9,504,164 B2

MANUFACTURING OF HIGH RESOLUTION CONDUCTIVE PATTERNS USING ORGANOMETALLIC INK AND BANDED ANILOX ROLLS

CROSS-REFERENCE TO RELATED APPLICATIONS

This application is a national stage of and claims priority under 35 U.S.C. 371 to International Patent Application Serial No. PCT/US2013/030450, filed on Mar. 12, 2013, entitled "MANUFACTURING OF HIGH RESOLUTION CONDUCTIVE PATTERNS USING ORGANOMETALLIC INK AND BANDED ANILOX ROLLS," Ed S. RAMAKRISHNAN, et al., which claims the benefit of and priority under 35 U.S.C. §119 to U.S. Provisional Patent Application No. 61/647,597, filed May 16, 2012, entitled "SYSTEMS AND METHODS FOR OPTIMIZING ANILOX ROLLS FOR MAKING HIGH-RESOLUTION, LOW-VARIANCE CONDUCTIVE PATTERNS, by Ed S. RAMAKRISHNAN, and U.S. Provisional Patent Application No. 61/642,919, filed May 4, 2012, entitled "METHOD FOR MAKING HRPS HAVING LOW VARIANCE THROUGH OPTIMIZATION OF INK VISCOSITY," by Ed S. RAMAKRISHNAN, et al., which are all hereby incorporated by reference in their entirety for all purposes.

FIELD OF THE INVENTION

This disclosure relates generally to the printing of high resolution patterns, specifically to ink viscosity optimization.

BACKGROUND

Flexographic printing may be used to print patterns using ink on a variety of substrates. The system used to flexographically print these substrates may comprise a number of rolls that have various functionalities. Conventionally, an anilox roll used in the flexographic printing process to transfer ink may be a ceramic coating over knurling on a metal component or chrome plating over knurling on a metal component, the metal component being a solid or multi-component piece made of stainless steel.

SUMMARY

In an embodiment, a method of making a touch sensor comprises: printing a first pattern and a second pattern, wherein the first pattern is flexographically printed using a first flexomaster, and wherein the second pattern is flexographically printed by a second flexomaster; wherein the first pattern comprises a first plurality of lines and the second pattern comprises a second plurality of lines, wherein the first plurality of lines and the second plurality of lines are formed from an ink comprising 1 wt %-20 wt % organometallics and at least one solvent, wherein the ink viscosity is from 1000 cps-3000 cps, and wherein printing comprises transferring the ink from an ink source by a first anilox roll to the first flexomaster and from the ink source by a second anilox roll to the second flexomaster, and wherein each line of the plurality of lines is between 1-25 micrometer wide. The embodiment further comprising wherein the first anilox roll and the second anilox roll have a volume and a lines per inch measurement and are engraved with a pattern of cells, and wherein the shape of the cells is one of a hexagon, triangle, diamond, circle, elongated cell, trihelic, or combinations thereof; wherein at least one of the first and the second anilox roll is a banded anilox roll, wherein the banded anilox roll comprises at least one of two or more different cell shapes or two or more different volumes; and plating the first and the second patterns.

In an embodiment, a method of making an RF antenna comprises: printing a first substrate and a second substrate, wherein a first antenna loop array is flexographically printed on the first substrate by a first flexomaster, and wherein a second antenna loop array is flexographically printed on the second substrate by a second flexomaster; wherein the first and the second antenna loop arrays are formed from an ink comprising 1 wt %-20 wt % organometallics and at least one solvent, wherein the ink viscosity is from 1000 cps-3000 cps and may also be 200 cps-20000 cps, and wherein printing comprises transferring the ink from an ink source by a first anilox roll to the first flexomaster and from the ink source by a second anilox roll to the second flexomaster. The embodiment further comprising wherein the first anilox roll and the second anilox roll have a volume and a lines per inch measurement and are engraved with a pattern of cells, and wherein the shape of the cells is one of a hexagon, triangle, diamond, circle, elongated cell, trihelic, or combinations thereof; wherein at least one of the first and the second anilox roll is a banded anilox roll, wherein the banded anilox roll comprises at least one of two different cell shapes or two different volumes; and plating the first and the second antenna loop arrays, wherein the first antenna loop array and the second loop antenna array comprise at least one line plated with a conductive material, and wherein the at least one line is 1 micrometer-25 micrometers wide.

In an embodiment, a method of using a banded anilox roll to manufacture a high resolution conductive pattern comprises: preparing an ink, wherein preparing the ink comprises adding at least one of a solvent or a co-solvent to the ink, and wherein the prepared ink has a viscosity greater than 200 cps; cleaning a substrate; disposing the ink on the substrate using a flexographic printing process comprising a first flexoplate and a first ink source, wherein depositing the ink on the substrate comprises: transferring, by a roll-to-roll handling process, the ink from an ink source to an anilox roll; and subsequently transferring the ink from the anilox roll to a flexoplate, wherein the flexoplate comprises a first pattern comprising a first plurality of lines, wherein each line of the first plurality of lines is from 1 micrometer-25 micrometers wide. The embodiment further comprising wherein the anilox roll has a volume and a lines per inch measurement and are engraved with a pattern of cells, and wherein the shape of the cells is one of a hexagon, triangle, diamond, circle, elongated cell, trihelic, or combinations thereof; wherein the anilox roll is a banded anilox roll, wherein the banded anilox roll comprises at least one of two different cell shapes or two different volumes; and plating the first printed pattern, wherein plating the first printed pattern comprises depositing a conductive material on to the first printed pattern to form a high resolution conductive pattern.

BRIEF DESCRIPTION OF THE DRAWINGS

For a detailed description of exemplary embodiments of the invention, reference will now be made to the accompanying drawings in which:

FIGS. 7A-7F are illustrations of various geometries of engraved anilox roll patterns according to embodiments of the disclosure.

DETAILED DESCRIPTION

Figure 1:
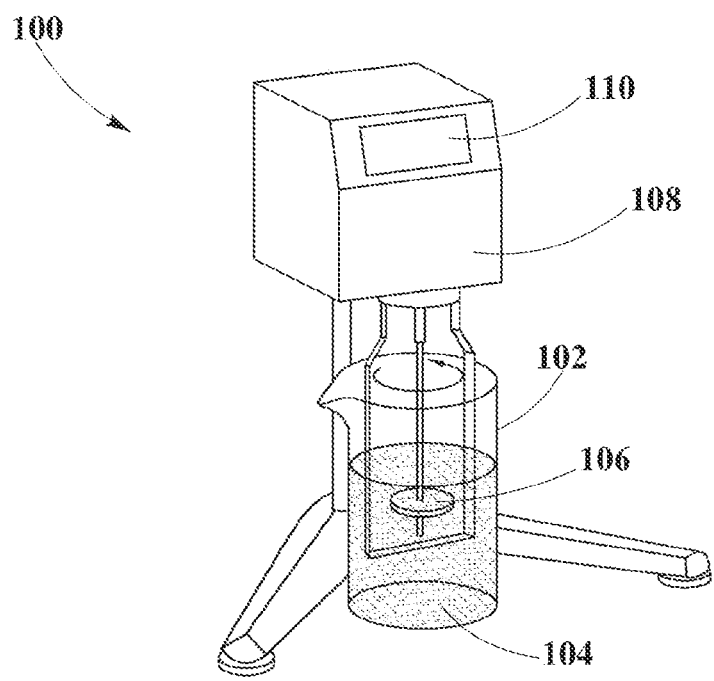
FIG. 1 is an illustration of a rotational viscometer.

The following discussion is directed to various embodiments of the invention. Although one or more of these embodiments may be preferred, the embodiments disclosed should not be interpreted, or otherwise used, as limiting the scope of the disclosure, including the claims. In addition, one skilled in the art will understand that the following description has broad application, and the discussion of any embodiment is meant only to be exemplary of that embodiment, and not intended to intimate that the scope of the disclosure, including the claims, is limited to that embodiment.

Flexography is a form of a rotary web letterpress where relief plates are mounted on to a printing cylinder, for example, with double-sided adhesive. These relief plates, which may also be referred to as a master plate or a flexoplate, may be used in conjunction with fast drying, low viscosity solvent, and ink fed from anilox or other two roller inking system. The anilox roll may be a cylinder used to provide a measured amount of ink to a printing plate. The ink may be, for example, ultraviolet (UV)-curable inks or water-based thermal, IR curable inks. In one example, a first roller transfers ink from an ink pan or a metering system to a meter roller to an anilox roll. The ink is metered to a uniform thickness when it is transferred from the anilox roller to a plate cylinder. When the substrate moves through the roll-to-roll handling system from the plate cylinder to the impression cylinder, the impression cylinder applies pressure to the plate cylinder which transfers the image on to the relief plate to the substrate. In some embodiments, there may be a fountain roller instead of the plate cylinder and a doctor blade may be used to improve the distribution of ink across the roller.

Flexographic plates may be made from, for example, plastic, rubber, elastomer, or a photopolymer which may also be referred to as a UV-sensitive polymer. The plates may be made by laser engraving, photomechanical, or photochemical methods. The plates may be purchased or made in accordance with any known method. The preferred flexographic process may be set up as a stack type where one or more stacks of printing stations are arranged vertically on each side of the press frame and each stack has its own plate cylinder which prints using one type of ink and the setup may allow for printing on one or both sides of a substrate. In another embodiment, a central impression cylinder may be used which uses a single impression cylinder mounted in the press frame. As the substrate enters the press, it is in contact with the impression cylinder and the appropriate pattern is printed. Alternatively, an inline flexographic printing process may be utilized in which the printing stations are arranged in a horizontal line and are driven by a common line shaft. In this example, the printing stations may be coupled to curing stations, cutters, folders, or other post-printing processing equipment. Other configurations of the flexo-graphic process may be utilized as well.

In an embodiment, flexo plate sleeves may be used, for example, in an in-the-round (ITR) imaging process. In an ITR process, the photopolymer plate material is processed on a sleeve that will be loaded on to the press, in contrast with the method discussed above where a flat plate may be mounted to a printing cylinder, which may also be referred to as a conventional plate cylinder. The flexo-sleeve may be a continuous sleeve of a photopolymer with a laser ablation mask coating disposed on a surface. In another example, individual pieces of photopolymer may be mounted on a base sleeve with tape and then imaged and processed in the same manner as the sleeve with the laser ablation mask discussed above. Flexo-sleeves may be used in several ways, for example, as carrier rolls for imaged, flat, plates mounted on the surface of the carrier rolls, or as sleeve surfaces that have been directly engraved (in-the-round) with an image. In the example where a sleeve acts solely as a carrier role, printing plates with engraved images may be mounted to the sleeves, which are then installed into the print stations on cylinders. These pre-mounted plates may reduce changeover time since the sleeves can be stored with the plates already mounted to the sleeves. Sleeves are made from various materials, including thermoplastic composites, thermoset composites, chromium, nickel, and stainless steel, and may or may not be reinforced with fiber to resist cracking and splitting. Long-run, reusable sleeves that incorporate a foam or cushion base are used for very high-quality printing. In some embodiments, disposable "thin" sleeves, without foam or cushioning, may be used. Flexographic printing processes may use anilox rolls for ink transfer as a means of metering the ink so that the ink prints the desired pattern with clear, uniform features free of clumping or smearing. While some printed patterns may undergo further processing such as plating with a conductive material, printed patterns may still be utilized in applications such as improving contrast ratio, preventing Moiré effects, and for enabling viewing privacy for display devices. For example, a striped pattern with a specified pitch, where the pitch is the center-to-center distance of two adjacent stripes, and aspect ratio may be formed using a black ink on the surface of a film.

Conventional methods of printing high resolution patterns onto suitable substrates may result in varied pattern quality and uniformity, which may result in the plated patterns having poor conductivity, variable resistance, and overall poor performance. The variability in the patterns may result from highly variable ink viscosity, particularly when printing large surface area substrates with microscopic dimensions, and may also result when too much or too little ink is transferred on to the substrate. Conventionally, an anilox roll used in the printing process may be a ceramic coating over knurling on a metal component or chrome plating over knurling on a metal component, the metal component being a solid or multi-component piece made of stainless steel. A ceramic over knurl is a roll which has a layer of copper built up on its face. A knurling tool is forced against the copper, reforming the surface into the shape of the knurling tool points. After engraving, the roll is plasma spray coated with a thin layer of ceramic to provide support to the fragile cell wall structure. However, this process may have inconsistencies in the deposition of the ceramic powder. The types of patterns, cell volumes, and available line counts may be limited due to limitations in the knurling tool technology. In addition, the ceramic has a poor mechanical bond to the copper. This can lead to delamination in ultrasonic and other cleaning systems.

The second type of anilox engraving starts from a copper base material on the surface of the roll. The copper is soft and malleable, so it conforms to the shape of a knurling tool. As the knurling tool is applied to the copper base material under pressure, the raised points of the knurling tool create the cell structure. While this procedure creates consistent cells, the cells can only be engraved to shallow depths and with a shallow wall pitch, so that the knurling tool can easily back out of the cells that were just created. Copper is advantageous because of its softness and ability to take the shape of the tool, which aid in the creation of the cells. Unfortunately, these same attributes cause the roll to wear out quickly and damage easily. To offset these limitations, the roll receives a microscopic layer of electroformed chrome which provides some durability and damage resistance. However, due to limitations in knurling tool technology, chrome engravings can only be engraved in patterns with a volume of about 500 cells/inch. This may limit both ink distribution ability and print quality depending on the size of the pattern printed. As anilox rolls may be a modular, interchangeable part of a system, the selection of an anilox roll for a particular application can mean the difference between a uniformly printed pattern and a non-uniform pattern that may have not formed properly and may be smeared or have other visual and functional defects. The difficulty in selecting an anilox roll for an application may increase as the dimensions of the lines to be printed decreases and/or the complexity of the pattern increases.

FIG. 1 is an illustration of a rotational viscometer. In FIG. 1, a rotational viscometer 100 used for measuring the viscosity of a material comprises an ink 104 disposed in a container 102. In some embodiments, the container 102 may comprise a beaker, for example, a glass beaker. The ink 104 may comprise binders, photo-initiators, and plating catalysts, and may be specially formulated for particular applications and/or processing methods. The term viscosity as used herein may refer to a fluid's internal resistance to flow and is a factor considered based upon the manufacturing system configuration as well as the end application because the wrong viscosity can clog the process or otherwise produce non-uniform patterns that may cause expensive scrap in the process. In an embodiment, a solvent may be used to dissolve at least one other material in the ink 104 and the viscometer 100 may be used to determine the viscosity of the ink 104 during or after a solvent or co-solvent is added to the ink. The solvent may be any fluid (i.e. gas, liquid) or solid that dissolves any solute, for example, isopropyl alcohol (IPA), methanol, ethyl lactate, ethylene glycol, dichloromethane, toluene, acetic acid. In some embodiments, a cosolvent (co-solvent) may be used. The cosolvent may be any fluid that, when mixed with another fluid such as another solvent can dissolve a solute.

In some embodiments, the rotational viscometer 100 includes a spindle 106 and a viscometer head 108 comprising a display 110 which may also be referred to as a user interface or a digital display. The display 110 may present a plurality of readings (not pictured) such as ink temperature, processing time, composition, and viscosity, some or all of which may be used to adjust the ink's composition until a desired range or target of at least one property is achieved. The spindle 106 is caused to rotate around its axis by a motor or other similar device in viscometer head 108. Another device (not pictured) may measure the resistance that spindle 106 experiences when rotating within sample 104, from which the viscosity of sample 104 may alternatively be found. The ink discussed herein may refer to any material which may be deposited on a surface or substrate as used in printing and may be any state of a liquid, such as a mixture, suspension, or colloid, without limitation. In certain instances, an ink may refer to a solid or liquid aerosol deposited on a surface. Preferably, the ink contains organometallic particles such as palladium acetate or palladium oxalate in a concentration from 1 wt. %-20 wt. %, preferably 1 wt. %-5 wt. %. The organometallic nano-particles are soluble in the binder material which may be an acrylic or other photocurable/thermal curable base material; therefore, the particles may not pose a concern with respect to causing clogs during the printing process. Conventionally, particulate size and content may present a concern during printing if the ink cannot flow properly because this may lead to the printing of non-uniform or incomplete patterns. This may be a concern if an anilox roll with a small volume is used to print a microscopic pattern because the anilox roll may and/or the flexoplate comprising the pattern to be printed may have small cells/grooves/recesses that are prone to clogging if the particulate size or content of the ink is too large/high. As such, the particulate content and size may be selected to minimize these concerns.

Figure 2:
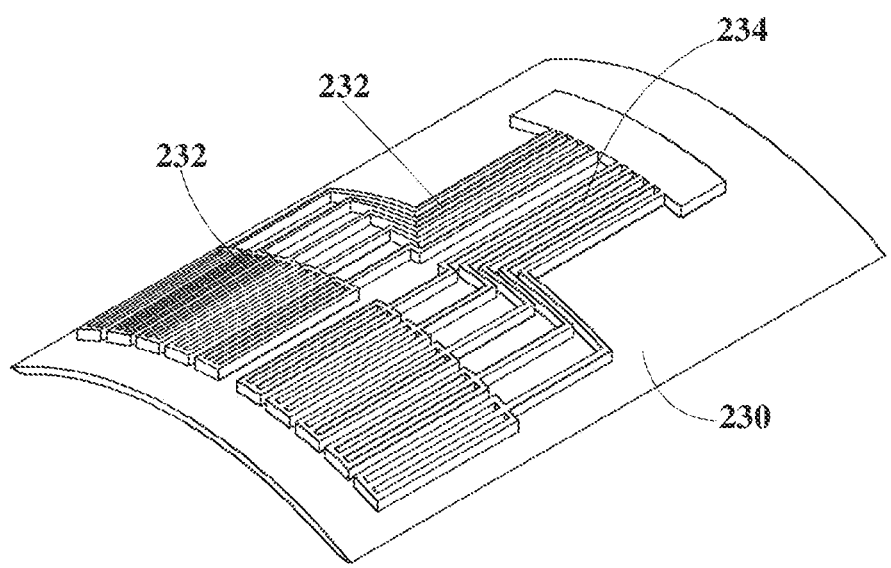
FIG. 2 is an illustration of a flexoplate according to embodiments of the disclosure.

FIG. 2 is an illustration of a patterned flexoblank that may also be referred to as a flexoplate according to embodiments of the disclosure. The flexoplate 230 comprises a pattern 234 that may comprise a plurality of lines 232. In some embodiments, the patterned flexoblank may be patterned for resistive or capacitive touch screen sensors. In alternate embodiments, the patterned flexoblank may be patterned for RF antenna structures, both single and multi-loop, or other applications where microscopic lines less than 25 micrometers are to be uniformly printed. The structures printed for RF antenna structures may be referred to as antenna loops, antenna arrays, or antenna loop arrays. In some examples, more than one flexoplate may be used to print a single pattern. In those examples, different types of ink may be used for each flexoplate and each flexoplate would be disposed on a separate roller to print a different part of the pattern in series.

Figures 3A, 3B:
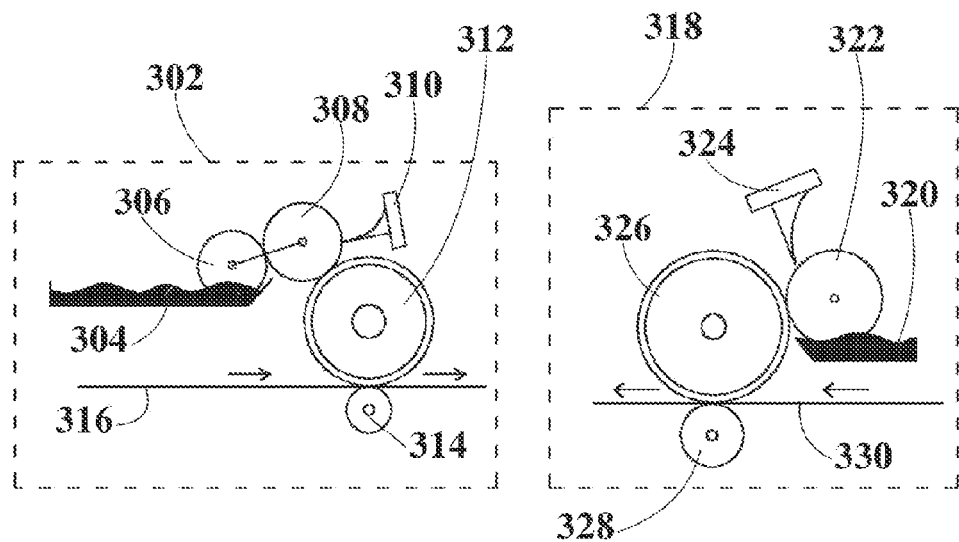
FIGS. 3A-3B are illustrations of precision ink metering systems used in flexographic printing according to embodiments of the disclosure.

FIGS. 3A-3B illustrate of precision ink metering systems used in flexographic printing according to embodiments of the disclosure. Flexographic printing is a direct, high pressure, relief printing process. It utilizes flexible printing plates or endless rubber sleeves carrying three dimensional relief printing areas that transfer ink directly to the material being printed. Flexographic printing may use different types of inks for different applications. For example, ink may be water-based, solvent-based, or UV-curable. In some embodiments, the ink may contain plating catalysts, binders, photoinitiators, or particles that act as catalysts to a plating process that may be used to make a printed pattern conductive for applications in electronics such as touch screens. In FIG. 3A, a first metering system 302 comprises a transfer roll 306, an ink pan 304, an anilox roll 308, a doctor blade 310, a pattern roller 314, and an impression roller 314 that may be used in conjunction to form a pattern on a substrate 316. In an embodiment, the transfer roll 306 may be made of natural or synthetic rubber and may be rotated through the ink contained in the ink pan 304, causing the exterior surface of the transfer roll 306 to be coated with ink. The transfer roll 306 may be in contact with and rotate relative to the anilox roll 308. The contact between the anilox roll 308 and the transfer roll 306 during rotation acts to transfer the ink from the exterior surface of the transfer roll 306 to the exterior surface of the anilox roll 308. The anilox roll 308 has a surface covered by small cells formed by walls that are filled by the ink as described in detail in FIGS. 6A-6B and 7A-7F. In some embodiments, there may be excess ink on the surface of the anilox roll 308 which may be removed by the doctor blade 310. The pattern roller 312 may be placed between the anilox roll 308 and an impression roll 314. The exterior surface of the pattern roller 312 may be wrapped with a flexomaster which may also be referred to as a flexoplate, which may be adhered to the pattern roller 312 using double-sided adhesive tape or other attachment means. The flexomaster has an engraved pattern, for example as described in FIG. 2, that will be printed on the substrate 316. The anilox roll 308 rotates against the pattern roller 312, transferring the ink to the flexomaster on the surface of the pattern roller 312. The ink on the flexomaster is then impressed (printed) onto the substrate 316 as the substrate 316 passes between the pattern roller 312 and the impression roll 314, which serves as support for the substrate 316. The pressure between the anilox roll 308 and the pattern roller 312 may be minimized while maintaining contact between the anilox roll 308 and the pattern roller 312. The pressure between the pattern roller 312 and the impression roll 314 may also be regulated such that substrate 316 is not over inked or the printed image distorted.

FIG. 3B is an illustration of an alternate configuration of a metering system. The second metering system 318 in FIG. 3B comprises an ink pan 320, an anilox roll 322, a doctor blade 324, a master plate 326, an impression roller 328, and a substrate 330. In this configuration, the anilox roll 322 is semi-submerged in the ink contained by ink pan 320 and transfers ink from the ink pan 320 directly to the master plate 326. The anilox roll 322 has a surface covered by small cells that are filled by the ink as the anilox roll 322 rolls through the ink pan 320. In some embodiments, some or all of the excess of ink on the surface of the anilox roll 322 is removed by the doctor blade 324. The master plate 326 may be disposed between the anilox roll 322 and the impression roll 328. The exterior surface of the master plate 326 is wrapped with a flexomaster (not pictured) which may be similar to FIG. 2 and which may be disposed on the master plate 326 using double-sided adhesive tape (not pictured). The pattern on the flexomaster may be the pattern that will be printed on the substrate 330. In an embodiment, the anilox roll 322 rotates against the master plate 326, transferring the ink to the flexomaster on the surface of the master plate 326. The ink on the flexomaster is then impressed onto the substrate 330 as it passes between the print roller 312 and the impression roll 314, which serves as support for the substrate 330. The pressure between the anilox roll 322 and the master plate 326 may be minimized while maintaining contact between the anilox roll 322 and the master plate 326. The pressure between the master plate 326 and the impression roll 328 may be regulated such that substrate 330 is not over inked or the image distorted.

It is appreciated that, in contrast to the system in FIG. 3A, a second metering system 318 in FIG. 3B does not have a transfer roll 306 as in the first metering system 302 of FIG. 3A. In FIG. 3B, the ink is transferred from the ink pan 320 directly on to the anilox roll 322. It should also be appreciated that it is the pattern of the flexomaster on the master plate 326 that is imprinted on to the substrate 330, and not the pattern engraved on the anilox roll 322. In either of the configurations shown in FIGS. 3A and 3B, the anilox roll used may depend on factors such as but not limited to the viscosity of the ink, the geometry of the pattern, the anilox-flexoplate transfer rate, the flexoplate-substrate transfer rate, and the speed of the process.

Figures 4A, 4B, 4C:
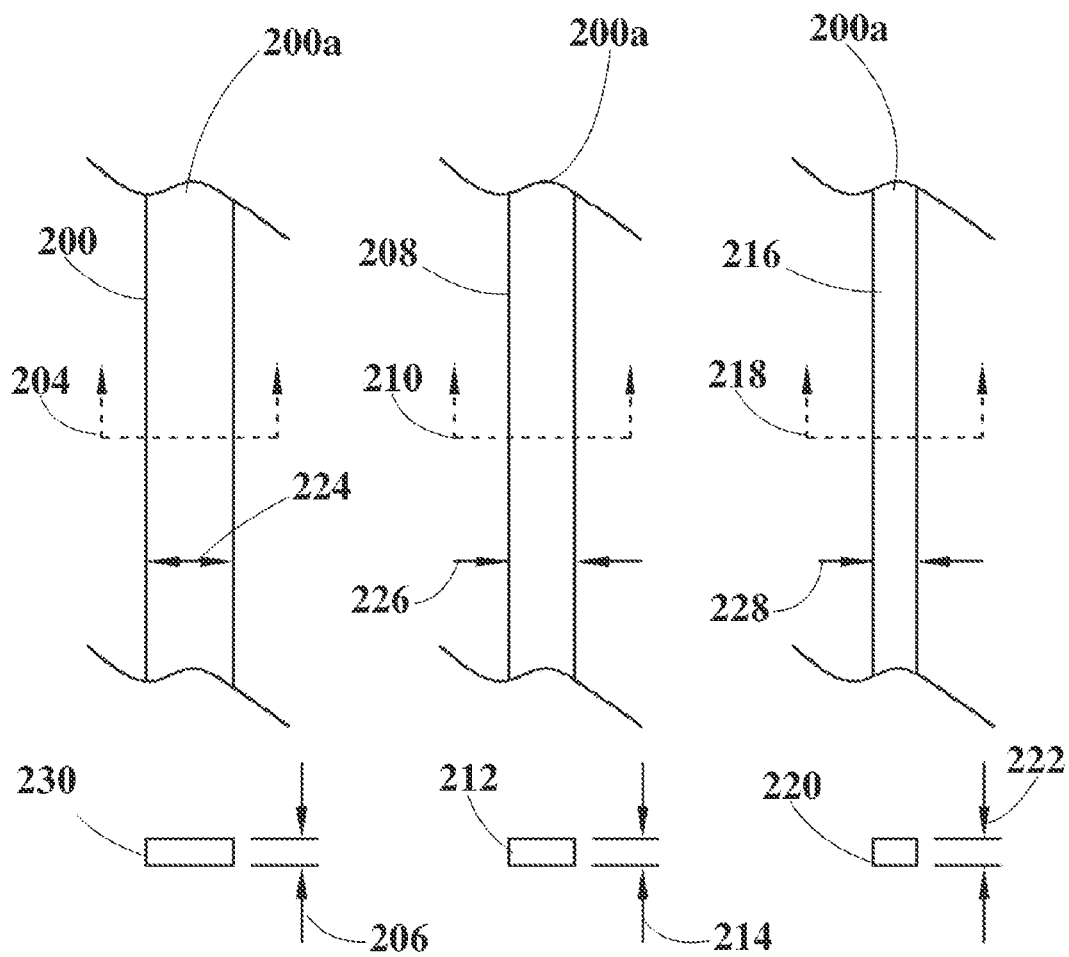
FIGS. 4A-4C are illustrations of top views and cross-sectional views of portions of lines printed by a flexoplate according to embodiments of the disclosure.

FIGS. 4A-4C are illustrations of printed high resolution printed patterns (HRP) of varying dimensions according to embodiments of the disclosure. FIG. 4A is an illustration of a line 200 from an HRP printed on substrate 200a, section line 204 defines cross section 230 which has a height 206 which may also be referred to as the thickness of the line 200. The thickness or height as used herein may refer to the average dimension of a HRP perpendicular to the printing plane of the substrate. Further, as used herein the term may refer to the vertical dimension of a printed pattern. A high resolution pattern (HRP), as discussed herein, may refer to a printed pattern comprising at least one line and in some embodiments a plurality of lines, where each line is less than 50 micrometers wide. A high resolution conducting pattern (HCRP) may refer to an HRP that has been plated. It is also appreciated that the terms HRP and HRCP may in some instances, including herein, be used interchangeably. As such, an HRP may be any conductive or non-conductive material patterned, deposited or printed onto a substrate surface. As used herein, each line of the HRP has a width or lateral measurement in the plane of the substrate surface of less than about 50 micrometers.

FIG. 4A shows line 200 a width 224. The line width 224 may be controlled by a combination of the speed, pressure, and flexoplate configuration in the printing process as depicted in the systems of FIGS. 3A and 3B. Similarly, FIG. 4B illustrates a line 208 from an HRP where a cross-section section 212 is defined by a section line 210 and has a height 214 which may also be referred to as the thickness of the line 208. The line 208 also has a width 226 that is smaller than the width 224 in FIG. 4A. FIG. 4C is an illustration of a line 216 from an HRP with a cross-section 220 defined by a section line 218 with a width 228, and a height 222 that may also be referred to as the thickness of the line 216. Both the width 228 and the thickness 222 may impact the type of ink used in the process as well as the type of curing performed after the pattern is printed. Various widths may be appropriate as illustrated in FIGS. 4A-4C depending upon the end application of the pattern, that is, where the finished product will ultimately be used.

In some embodiments, a pattern with smaller line widths, for example, 1 micrometer-25 micrometers, may be uniformly printed with a higher viscosity ink using an anilox roller with a small BCM volume. The ink may comprise organometallics in a concentration from 1 wt. %-20 wt. % where the ink is transferred from an ink source by an anilox roll of 0.7 BCM. In one example, the viscosity of the ink used to print the line 200 in FIG. 4A may be lower than the viscosity used to print the line 216 in FIG. 3C. In another example, an anilox roll with a BCM higher than that used to print the line 216 in FIG. 3C may have been used to print the line 200 in FIG. 4A In some embodiments, a 0.7 BCM anilox roll may be used to print lines from 1 micrometer-20 micrometers wide with an ink comprising a viscosity between 1000-3000 cps. In that embodiment, the line speed may be 50 ft./min. This is in contrast to embodiments where thicker lines, for example, 30 micrometers-65 micrometers wide, are printed at 50 ft./min using ink with a viscosity below 750 cps using a 1.5 BCM anilox roll. The combination of the ink viscosity, desired line width, and volume of anilox roll may be used to create a uniform pattern for varying line widths. In one example, an anilox roll may pick up a volume X of ink from the ink pan and transfer ½ of that volume to the flexoplate, which may transfer ½ of ½X (so ¼X where X is the initial volume picked up from the ink pan) to the substrate. As such, the final desired ink thickness on the substrate may be considered when determining process parameters and the system configuration including which anilox roll or banded anilox roll to use.

Figure 5:
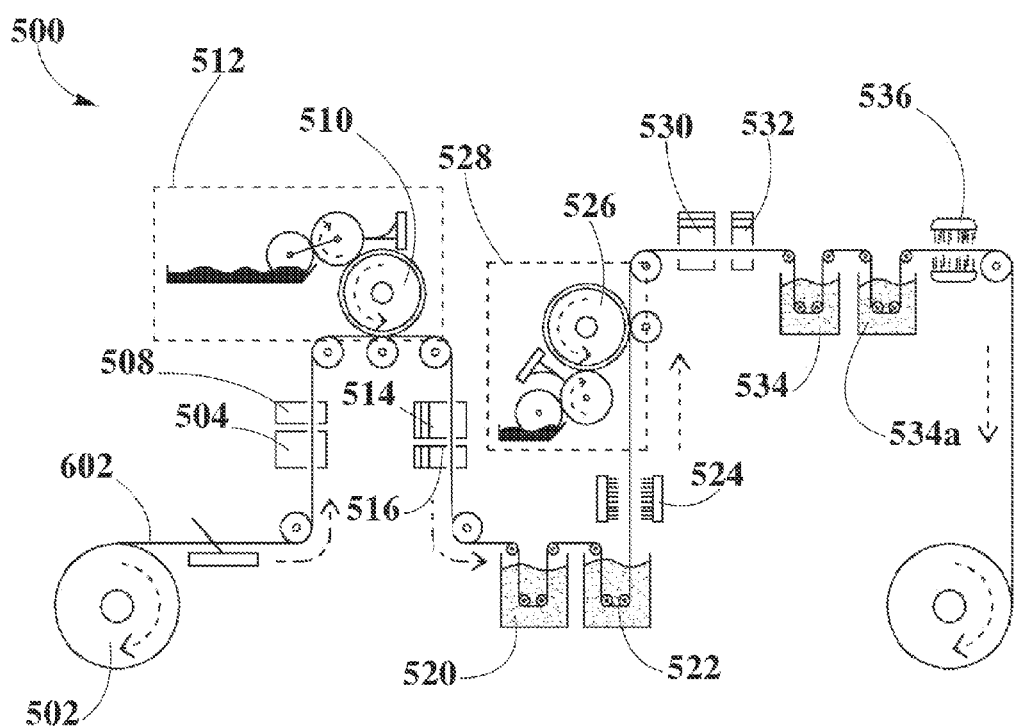
FIG. 5 is an illustration a method of fabrication of a high resolution conductive pattern according to embodiments of the disclosure.
Figure 9:
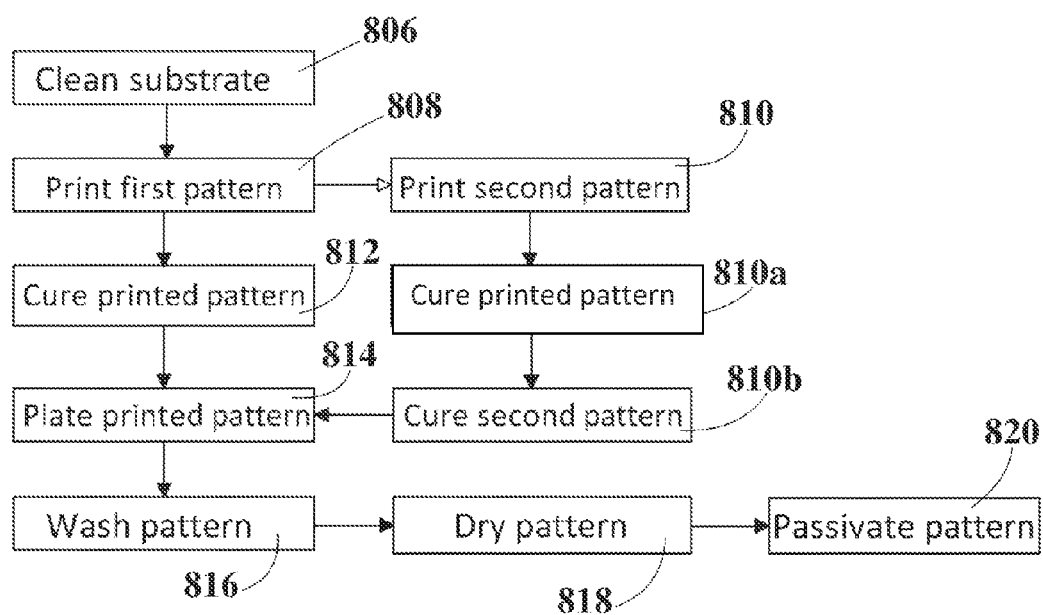
FIG. 9 is a flowchart of a manufacturing process for high resolution conductive patterns according to embodiments of the disclosure.

FIG. 5 is an illustration of a method of fabrication of a high resolution conductive pattern according to embodiments of the disclosure. FIG. 9 is a flowchart of a method of fabrication of a high resolution conductive pattern according to embodiments of the disclosure. FIG. 5 illustrates a method 500 used to fabricate a touch sensor or another product that comprises a microscopic pattern. A substrate, for example, an elongated, flexible, thin film 602 is placed on unwind roll 502 to be printed, this thin film is referred to herein as a substrate. Transparent substrates such as PET (polyethylene terephthalate), polyester and polycarbonate may be used as the substrate 602. Alternatively, the substrate 602 may be paper, glass, metallic film, or metallic foil. The thickness of the substrate 602 may be small enough to avoid excessive stress during flexing of the touch sensor or antenna. In addition, it is noted that a thin film may improve optical transmissivity. On the other hand, the thickness of the substrate 602 should not be so small as to jeopardize the continuity of this layer or its material properties during the manufacturing process. Preferably, a substrate 602 thickness between 1 micrometer and 1 millimeter may be suitable.

Turning to FIG. 9, a plurality of process parameters including run speed, ink viscosity, and ink type as determined by the geometry, dimensions, and intricacy of the at least one pattern to be printed are used to adjust the system configuration including the selection of anilox roll. The anilox roll may be selected for its volume, geometry, or both. In addition the anilox roll may be a combination of geometries and sizes which may be referred to as a banded roll or a banded anilox roll. Once the anilox roll or banded anilox roll is selected for use in the manufacturing process, turning back to the method 500, the substrate 602 is transferred, for example, via any known roll to roll handling method, from an unwind roll 502 to be cleaned at block 806 at a first cleaning at a first cleaning station 504. In some embodiments, the cleaning at block 806 may comprise one or more cleaning stations. As the roll to roll process involves a flexible material, the alignment of features may be challenging. Alignment of the substrate with respect to the in-line process may matter because of the ultimate alignment and location of the printed pattern(s) on the substrate. In one embodiment, a positioning cable 506 is used to maintain proper alignment of the features, in other embodiments any known means may be used for this purpose. In some embodiments, the first cleaning at block 806 at cleaning station 504 comprises a high electric field ozone generator used to remove impurities, such as oils or grease.

In some embodiments, the substrate 602 may undergo a second cleaning at block 806 at a second cleaning station 508. The second cleaning station 508 may comprise a web cleaner. A web cleaner is any device used in web manufacturing to remove particles from a web or substrate. After these cleaning stages at block 806, the first pattern can be printed at block 808 on a first side of the substrate 602 at a first printing station 510. The first pattern may comprise a plurality of lines where each line is from 1 micrometer-25 micrometers wide. The microscopic pattern is imprinted by a first master plate (flexoplate) at the first printing station 510 using UV curable ink that may have a viscosity between 200 and 2000 cps. The printing station may be configured as illustrated in FIGS. 3A and 3B. Further, the microscopic pattern may comprise lines having a width between 1 micrometer-35 micrometers. In an embodiment, a plurality of rolls may be used to print the pattern (not pictured) and the plurality of rolls may use different inks, similar inks, or the same ink. The ink type used may depend on the geometry and complexity of the features of the pattern because the pattern may comprise a plurality of lines with different thicknesses, connecting features, geometries of connecting features, and cross-sectional geometries. Additionally, the anilox roll as discussed in FIGS. 3A and 3B may be chosen in light of the printed pattern's geometry, an anilox-flexoplate transfer rate, a flexoplate-substrate transfer rate, a surface energy of the flexoplate, and a surface energy of the substrate.

Figure 8:
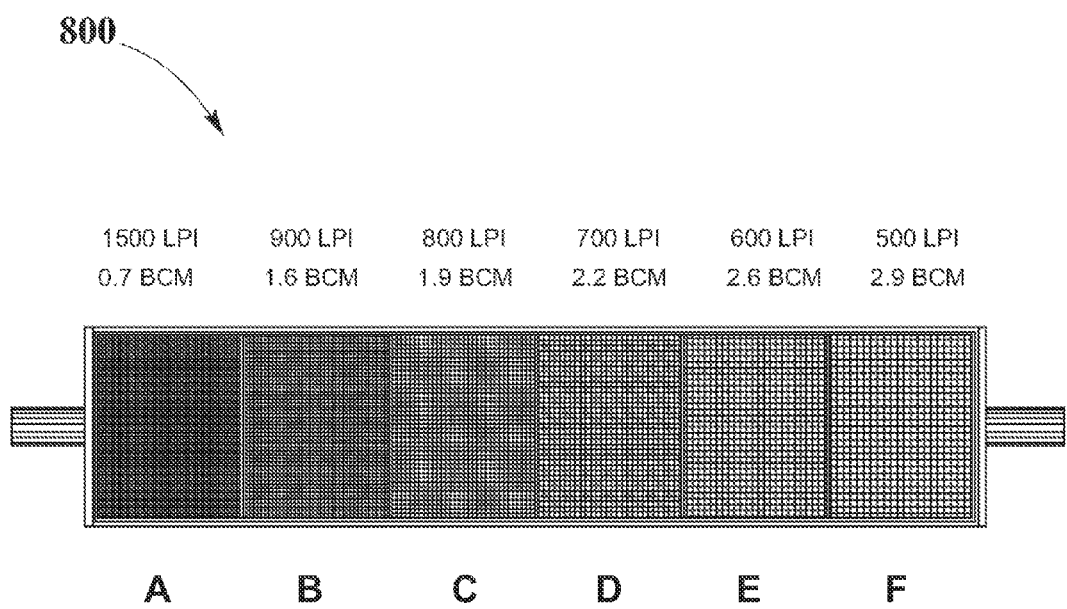
FIG. 8 is an illustration of a banded anilox roll according to embodiments of the disclosure.

Conventionally, prior to production, a banded roll such as in FIG. 8 may be used to test the first master plate at the first printing station 510 as well as the second master plate at a second printing station 526 discussed below so that the correct anilox roll is selected. The banded roll may be used to determine how a plurality of volumes and/or geometries transfer ink to print a specific pattern or a plurality of lines of a certain width and/or thickness or ranges of width or thickness. Conventionally, this banded roll is used for testing purposes to determine which anilox roll or rolls are appropriate for a particular application or pattern geometry. However, and as discussed herein, a banded roll as illustrated in FIG. 8 may be used in production, that is, as part of the manufacturing process, to transfer ink. The banded roll may comprise a combination of volume and/or geometries on one roll that would best suit the application and/or the system. In an embodiment, the banded roll may be used to transfer ink to print a complex geometry that may comprise a wide range of the widths of the lines, complicated transitions, or a combination of these and other features. This is discussed in detail below. The ink composition may be selected based upon a process speed, an anilox-flexoplate transfer rate, a flexoplate-substrate transfer rate, a surface energy of the flexoplate, and a surface energy of the substrate. It is appreciated that, in some embodiments, only one printing process may be used to print either a single loop or a multiple-loop antenna structure (not pictured). In alternate embodiments, a plurality of flexoplates disposed on a plurality of rollers may be used to print one or both sides of a substrate. This may be, for example, because different inks are used to print features of the pattern or patterns.

The amount of ink transferred to the substrate 602 at the first printing station 510 may be regulated by a high precision metering system 512, which may be comprise various configurations including, for example, those illustrated in FIGS. 3A and 3B. The speed of the machine may vary from 20 feet per minute (fpm) to 750 fpm, while 50 fpm to 200 fpm may be suitable for some applications. The ink may contain plating catalysts. The first printing process may be followed by a curing at block 812, which may comprise one or more curing stations. The first curing may comprise an ultraviolet light curing at a first curing station 514 with target intensity from about 0.5 mW/cm$^2$ to about 50 mW/cm$^2$ and wavelength from about 280 nm to about 600 nm. In addition, curing 812 may comprise an oven heating curing at a second curing station 516 that applies heat within a temperature range of about 20° C. to about 85° C. Subsequent to the curing at block 812, the substrate 602 may be exposed to electroless plating at plating station 520. In this step a layer of conductive material is deposited on the microscopic pattern by, for example, electroless plating 814. This may be accomplished by submerging the first pattern printed at first printing station 510 which may be a microscopic pattern comprising a plurality of lines on the first side of the substrate 602 into a plating station 520.

The plating station 520 may comprise a tank that contains copper in a liquid state at a temperature range between 20 and 90° C., with 80° C. being applied in some embodiments. Alternatively, the conductive material may comprise at least one of silver (Ag), gold (Au), nickel (Ni), tin (Sn), and Palladium (Pd), aluminum (Al), zinc (Zn), or combinations thereof. The deposition rate may be about 10 nanometers per minute (nm/min) and the plating station 520 may deposit the conductive material to a thickness of about 0.001 micrometer to about 100 micrometers, depending on the speed of the web and according to the application. This electroless plating process does not require the application of an electrical current and it only plates the patterned areas containing plating catalysts that were previously activated by the exposure to UV radiation during the curing process. The plating at block 814 may be an electroless plating station 520 and may comprise a bath that may include powerful reducing agents, such as borohydride or hypophosphite, which may promote the plating process at block 814. The plating thickness resulting from electroless plating may be more uniform compared to electroplating due to the absence of electric fields. Although electroless plating may be more time consuming than electrolytic plating, electroless plating may be well suited for parts with complex geometries and/or many fine features such as those that may be present in a high resolution conducting pattern. The substrate 602 may be washed at block 816 at washing station 522 after electroless plating at plating station 520. The substrate 602 may be cleaned by being submerged into a cleaning tank that contains water at room temperature. The substrate 602 may then be dried at block 818 at drying station 524 by the application of air at room temperature. In another embodiment, the substrate may be passivated at block 820, for example, in a pattern spray after the drying step to prevent any dangerous or undesired chemical reaction between the conductive materials and water or moisture.

In an embodiment, a second pattern may be printed at block 810 by a second master plate at second printing station 526 using UV curable ink that may have a viscosity between 200 and 2000 cps. It is appreciated that the printing stations 510 and 526 may comprise one or more master plates (also referred to as flexoplates) on one or more rolls. It is also appreciated that different inks may be used on each roll, and that different rolls may be employed based on the geometry and complexity of the first or the second printed pattern. Preferably, the first and the second patterns are printed simultaneously, in an alternate embodiment, the patterns may be printed in series. The amount of ink transferred at printing station 526 to the substrate 602 may be regulated by a high precision metering system 528 and may depend on the speed of the process, ink composition and patterns shape and dimension. Following the second printing process substrate 602 may be cured at block 810b at a third curing station 530 using ultraviolet light with an intensity from about 0.5 mW/cm$^2$ to 20 mW/cm$^2$. It is appreciated that, in some embodiments, when the first and second patterns are printed simultaneously or in series that the patterns may both be cured simultaneously. The third curing station 530 may be followed by another cure, for example, oven drying at block 810a at drying station 532 at a temperature between 20° C. and 150° C. Subsequently, the substrate 602 may undergo plating 814 at second plating station 534a, similar to the electroless plating at plating station 520, and a second wash at wash station 534, using known conventional washing techniques, and then the substrate 602 may be dried using air at room temperature in at drying station 536.

In some embodiments, the second pattern is printed on the first side of the substrate 602 opposite to the first pattern. In other embodiments, the second pattern is printed on the same (first) side of the substrate 602, adjacent to the first pattern, and in still other embodiments the second pattern is printed on a different film from substrate 602. In the latter two embodiments, the patterns are assembled subsequent to printing, and may also be assembled subsequent to plating. Preferably, in any embodiment, the printing and plating processes are performed in parallel instead of in series, that is, neither pattern has to wait on the other pattern to be printed and plated prior to assembly because either both patterns are on the same side of one substrate, both patterns have been assembled in-line, or both patterns are plated and ready to assemble and come out of the process at about the same time.

Figure 6A:
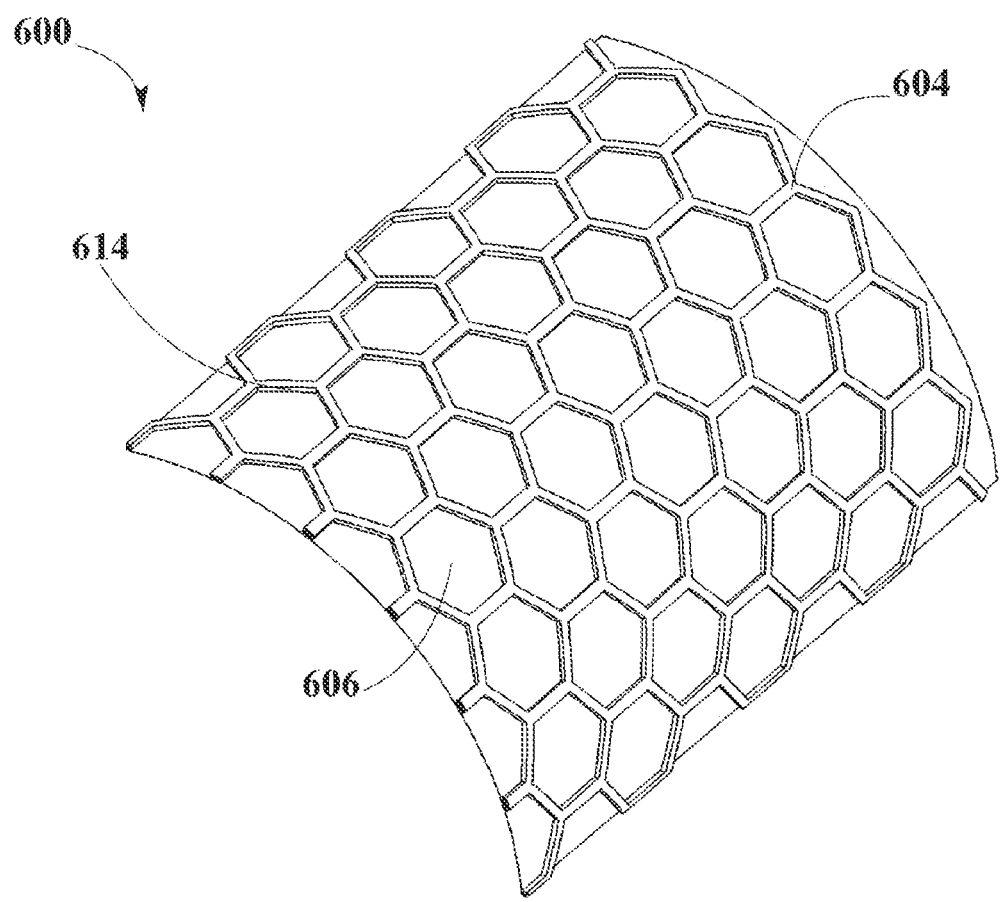
FIG. 6A is an illustration of an isometric view of a section of an engraved pattern on an anilox roll according to embodiments of the disclosure.

FIG. 6A is an illustration of an isometric view of a section of an engraved pattern on an anilox roll according to embodiments of the disclosure. Anilox roll section 600 comprises a plurality of hexagonally shaped cells formed by a plurality of walls 614 with a depth 604 that are arranged to form a plurality of wells 606 that may also be referred to as recesses or cells. A recess may refer to an empty region in an object, or to an indention or dimple into the plane of a surface of an object. In some embodiments, a recess may be a second surface offset below or behind a first parallel surface of an object. In some embodiments, the cells may be four-sided, triangular, circular, trihelic, elongated cells, or a combination thereof. The anilox roll may be defined by the volume that the roll can carry which may be referred to as billion cubic microns per square inch (BCM) in addition to or as an alternative to lines per inch (LPI) which refers to the number of cells per lineal inch as measured along the engraving angle.

Figure 6B:
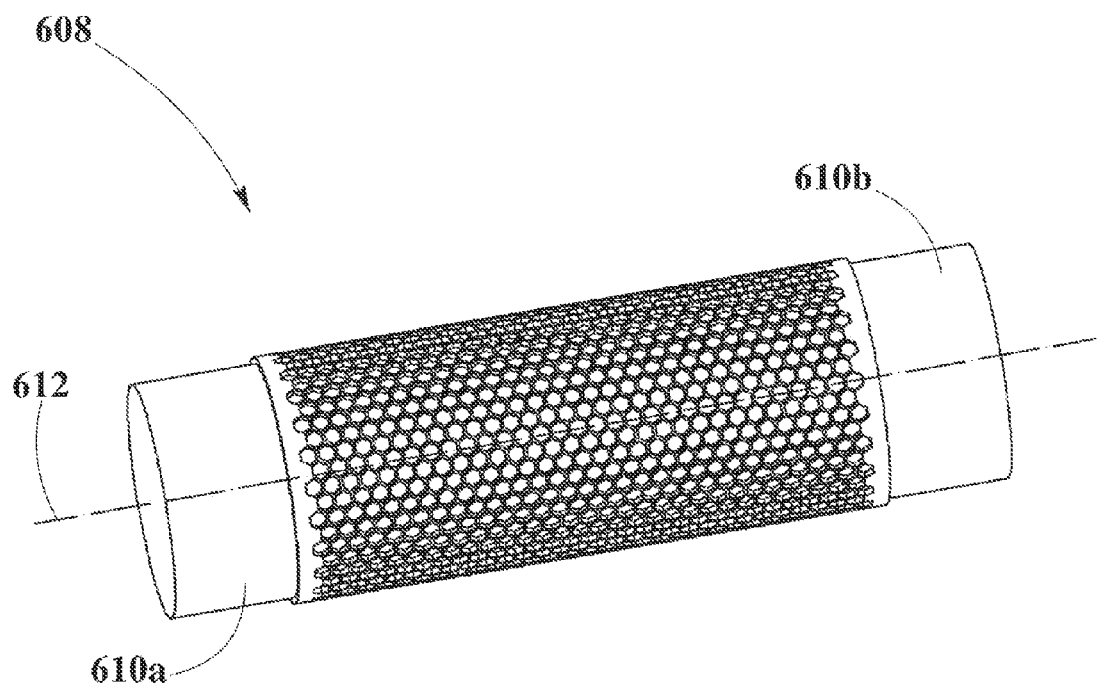
FIG. 6B is an isometric view of an engraved anilox roller according to embodiments of the disclosure.

FIG. 6B is an isometric view of an engraved anilox roller according to embodiments of the disclosure. In a flexographic printing process, the anilox roller 608 picks up a controlled amount of ink (e.g., from an ink pan or through contact with a roller coated with ink) and transfers it to a master plate. Thus, the anilox roll pattern is not printed on the substrate but rather acts as a transfer mechanism to migrate the ink from the ink source to the flexoplate which prints the pattern (which is located on the flexoplate) on the substrate. The anilox roll may be machined from a solid piece to form a first end piece 610a and a second end piece 610b as well as a plurality of small pockets or cells 606 disposed circumferentially around the surface in between end pieces 610a and 610b. In an alternate embodiment, the roller 608 is manufactured from multiple components and the end pieces 610a and 6106b are actually end caps that have been thermally, mechanically, or thermo-mechanically assembled to a third portion containing the plurality of cells 606. The plurality of cells 606 carry the ink, adhesive, or coating material to be applied to the master plate, and therefore the geometry of the cells can be chosen so that the roller 610 is capable of precisely metering various liquids prior to transfer to the master plate. The size of the plurality of cells 606 determines how much liquid each cell will carry. In an embodiment, the plurality of cells are uniform in shape and size. In another embodiment, the plurality of cells comprises a plurality of geometries as discussed below in FIGS. 7A-7F. When the anilox roll 608 comes into contact with surfaces of the master plate, which may be raised, the liquid is transferred to the surface of the master plate from the cells. In accordance with various embodiments, anilox rolls are engraved to different diameters, depths, and cell placement angles to accommodate a wide range of metering needs in flexoprinting. The combination of cell volume, engraving angle, and line count may define the quantity of ink transferred and precision and uniformity with which the ink transferred to the substrate.

The engraving angle or pattern refers to the orientation of cells in subsequent rows of engraving as referenced from the horizontal axis of the roll (e.g., axis 612 shown in FIG. 2). The engraving angle may also determine the shape of the cells. For a laser-engraved roll, the laser engraving occurs at extremely high frequencies and on a microscopic level. Thus, it may be difficult to make out a given burst of energy, or the cell resulting from the burst of energy, with the unaided eye. A 45-degree pattern appears diamond-shaped, while 30- or 60-degree patterns create hexagonal-shaped cells. If the rows of engraving are close enough, the cells overlap to eliminate the diagonal cell wall completely, thus forming a series of angular grooves commonly referred to as a trihelic engraving. Line count (LPI or lines per inch) refers to the number of cells per linear inch as measured along the engraving angle, or where the cells are aligned in closest proximity to each other. That is, a higher LPI provides a greater number of cells in a given surface area and a smaller cell diameter. As the LPI increases, the concentration of cells in both the rotational and transversal directions also increases. Doubling the LPI effectively quadruples the number of cells in each square inch of roll surface. As LPI increases, smaller droplets of ink may be spaced closer together onto the plate surface. Smaller ink droplets tend to dry more quickly than larger droplets and produce smoother solids as a result. The increased number of cells at a higher LPI provides for smoother transition of ink. In other words, anilox rolls that have a higher LPI provide a better rate of ink transmission.

FIGS. 7A-7F are illustrations of various geometries of engraved anilox roll patterns according to embodiments of the disclosure. FIG. 7A is an illustration of an embodiment of an engraved hexagonal pattern with a 30-degree engraving. The 30-degree pattern has hexagonal cells with the widest part of the opening 712 oriented along the horizontal axis of the roll (e.g., axis 202 shown in FIG. 6B). The pattern shown in FIG. 7A is a general-purpose pattern that may be used in conjunction with UV-curable inks.

FIG. 7B is an illustration of an embodiment of an engraved pattern with a 60-degree engraving. The 60-degree pattern appears similar to the 30-degree pattern, but with the widest part of the cell opening oriented along the rotational axis of the roll (e.g., orthogonal to axis 202 shown in FIG. 6B). The 60-degree pattern provides about 15% more cells per square inch as compared to a 45-degree pattern, due to the fact that the cells are packed more closely. These additional cells enable a more uniform distribution of ink to the master plate. The 60-degree pattern has a corner located at the top 702 and bottom 704 as the anilox roll rotates past the doctor blade, which may allow the doctor blade to fill the cell with less trapped air.

FIG. 7C is an illustration of an embodiment of an engraved pattern with a 45-degree engraving. The 45-degree pattern has a plurality of diamond-shaped cells 306 with the widest part 708 of the cells oriented along the rotational axis of the roll (e.g., orthogonal to axis 202 shown in FIG. 6B and represented in FIG. 7C as well). This pattern provides good ink release, but for fine distribution the 30- or 60-degree patterns in FIGS. 3A and 3B may be preferred.

FIG. 7D is an illustration of an embodiment of an engraved pattern with a plurality of randomly placed circular cells. The random pattern has cells placed in no particular orientation with subsequent rows of engraving. In color printing, the random pattern may be preferable because it may be less susceptible to the moiré pattern from the alignment between the cell placement and the screen angle. However, a random pattern has a plurality of cells of varying diameters and inconsistent placements, which may lead to inconsistency in the transfer of ink to the master roll and subsequently onto the substrate and may impact the quality of the printed pattern.

FIG. 7E is an illustration of an embodiment of an engraved pattern with a slotted engraving pattern. The plurality of slotted cells have the opening stretched along the rotational axis of the roll 710 (e.g., orthogonal to axis 202 shown in FIG. 6A and represented in FIG. 7E as well), which allows easier release for viscous inks, metallic particles and adhesives.

FIG. 7F is an illustration of an embodiment of an engraved pattern with a trihelic engraving pattern. Trihelic engravings place the cells in such a manner as to create diagonal groves in the roll surface that may be at an angle of 20-70 degrees from the axis 202. Preferably, engravings with this geometry are used for the application of adhesives. Adhesives may be used, for example, to assemble a first and a second substrate, or two parts of a first substrate.

In addition to the volume of the anilox roll, and as discussed with respect to FIGS. 6A, 6B, and 7A-7F, the anilox roll can have patterns of varying geometries and sizes engraved on its surface. The relation between final line width and LPI and BCM of the optimum anilox roll can be calculated based on desired process speed, ink viscosity, surface energy of the flexo plate and the substrate, the amount of ink transferred from the anilox roll to the flexo plate and from the flexo plate to the substrate, and having a set starting line width on the flexo plate. With a combination of LPI, BCM, ink viscosity and printing conditions lines having a width of less than 10 micrometers may be achieved.

In some embodiments, anilox rolls with an LPI more than 1500 LPI and a BCM of less than 0.7 BCM may be custom-fabricated for use in printing lines less than 10 micrometers wide. It is appreciated that the use of anilox rolls with higher LP's and lower BCMs may experience clogging as the cells approach smaller sizes. However, these rolls may be used with higher viscosity inks, for example, inks with a viscosity from 400-20000 cps, and optimized impression conditions so that finer lines (<10 micrometers wide) can be correctly (uniformly) printed.

FIG. 8 is an illustration of a banded roll according to embodiments of the disclosure. Banded roll 800 is a single anilox roll that is engraved in sections, for example, sections A-F, with different patterns, line screens and volumes. In FIG. 8, section A is a 1500 LPI, 0.7 BCM section, section B is a 900 LPI, 1.6 BCM section, section C is an 800 LPI, 1.9 BCM section, section D is a 700 LPI, 2.2 BCM section, section E is a 600 LPI, 2.6 BCM section, and section F is a 500 LPI, 2.9 BCM section. It is appreciated that the shading reflected in sections A-F is only an illustration intended to reflect the differences in LPI and BCM between the bands and not an actual image of what each section looks like. The banded roll may be used as a test roll to identify the type of anilox roll needed for a particular job. In that example, a particular ink or a series of inks with varying viscosities and compositions may be used with the banded roll 400 in an ink metering system similar to FIG. 1A or 1B to print a pattern on a substrate or a series of substrates. Based upon the results of that printing test, the correct size roll or rolls may be selected for use with a particular ink to print a pattern with a particular geometry, line dimensions, or range of line dimensions.

Conventionally, banded rolls may be used to test how ink of varying viscosities and compositions is transferred on to a substrate and lines with a width smaller than 25 micrometers may not be printed with reliable uniformity. After this testing, an anilox roll may be selected for a particular application. However, in an embodiment of the present disclosure, a banded roll is used for production runs. The banded roll may be custom-made and comprise a plurality of sections where at least two sections differ in at least one of (1) cell geometry or (2) volume. In one example, a roll with 0.7 BCM and 1.5 BCM is used in a production run to print patterns for a resistive or capacitive touch screen sensor. In an embodiment, the banded anilox roll may be a combination of 0.7 bcm for the lines in the pattern (<25 micrometers) that form a grid once the printed and plated substrates are assembled, and 1.5 BCM region for the bezel area (the connecting pad area) which could be 50-100 micrometers in width in a touch panel. In alternate embodiments, various configurations of anilox volume and geometries may be used in combination with inks, preferably inks with a viscosity greater than 1000 cps inks to print patterns comprising a plurality of lines where each line is between 1 micrometer-25 micrometers wide. It is appreciated that this method could be applied not only to components for touch screen sensors, but also for RD antennas as well as other applications where uniform microscopic patterns are components of a structure.

The manufacturing method described herein is only one of the many configurations available for flexographic printing of HRPs, and as such the methods and values provided herein may be applicable to other configurations. Additionally, the viscosity values disclosed herein may be of use when printing patterns of other dimensions, down to 1 micrometers wide.

While the preferred embodiments of the invention have been shown and described, modifications thereof can be made by one skilled in the art without departing from the spirit and teachings of the invention. The embodiments described and the examples provided herein are exemplary only, and are not intended to be limiting. Many variations and modifications of the invention disclosed herein are possible and are within the scope of the invention. Accordingly, the scope of protection is not limited by the description set out above, but is only limited by the claims which follow, that scope including all equivalents of the subject matter of the claims. To further illustrate various illustrative embodiments of the present invention, the following examples are provided.

What is claimed is:

1. A method of making a touch sensor comprising:
   flexographically printing a first pattern on a substrate including transferring ink from a first ink source by a first anilox roll to a first flexomaster, and subsequently transferring the ink from the first flexomaster to the substrate; and
   flexographically printing a second pattern on a substrate including transferring ink from a second ink source by a second anilox roll to a second flexomaster, and subsequently transferring the ink from the second flexomaster to the substrate;
   wherein the first flexomaster includes a first region including a first plurality of lines having line widths between 1-25 micrometers and a second region including a second plurality of lines having line widths greater than 25 micrometers; and
   wherein the ink includes between 1 wt %-20 wt % organometallics and a solvent, and wherein a viscosity of the ink is from 200 cps-20000 cps,
   wherein the first anilox roll is a banded anilox roll including a first section corresponding to the first region of the first flexomaster and a second section corresponding to the second region of the first flexomaster, wherein the first section includes cells having a first cell shape and a first cell volume selected to be appropriate for printing the first plurality of lines and the second section includes cells having a second cell shape and a second cell volume selected to be appropriate for printing the second plurality of lines, and wherein the first cell shape is different than the second cell shape or the first cell volume is different than the second cell volume; and
   plating the first and the second patterns.

2. The method of claim 1, wherein plating the first and the second patterns includes using a conductive material, wherein the conductive material is copper (Cu), nickel (Ni), gold (Au), silver (Ag), tin (Sn), palladium (Pd), zinc (Zn), aluminum (Al) or combinations thereof.

3. The method of claim 1, wherein the substrate includes at least one of a polymer, a metallic film, a metallic foil, paper, organic material, and glass.

4. The method of claim 1, wherein the ink includes between 1 wt. %-5 wt. % organometallics.

5. The method of claim 1, wherein the solvent is at least one of isopropyl alcohol, methanol, ethyl lactate, ethylene glycol, dichloromethane, toluene, or acetic acid.

6. The method of claim 1, wherein the ink further includes a co-solvent, wherein the co-solvent is at least one of isopropyl alcohol, methanol, ethyl lactate, ethylene glycol, dichloromethane, toluene, or acetic acid, and wherein the co-solvent is at least one of a different type or a different concentration than the solvent.

7. The method of claim 1, wherein each line of the first plurality of lines have line widths between 1-15 micrometers.

8. The method of claim 1, wherein each line of the first plurality of lines have line widths between 1-5 micrometers.

9. A method of making a touch sensor comprising:
   flexographically printing a pattern on a substrate, including using a banded anilox roller to transfer ink from an ink source to a flexomaster, and subsequently transferring the ink from the flexomaster to the substrate; and
   using a plating station to plate a conductive material onto the printed pattern on the substrate;
   wherein the flexomaster includes a first region including a first plurality of lines having line widths between 1-25 micrometers and a second region including a second plurality of lines having line widths greater than 25 micrometers; and
   wherein the banded anilox roll includes a first section corresponding to the first region of the flexomaster and a second section corresponding to the second region of the flexomaster, wherein the first section includes cells having a first cell shape and a first cell volume selected to be appropriate for printing the first plurality of lines and the second section includes cells having a second cell shape and a second cell volume selected to be appropriate for printing the second plurality of lines, and wherein the first cell shape is different than the second cell shape or the first cell volume is different than the second cell volume.

10. The method of claim 9, wherein the first section of the banded anilox roll has a smaller cell volume than the second section of the banded anilox roll.

* * * * *